United States Patent [19]

Leidich

[11] 4,242,643

[45] Dec. 30, 1980

[54] VARIABLE GAIN CURRENT AMPLIFIER

[75] Inventor: Arthur J. Leidich, Flemington, N.J.

[73] Assignee: RCA Corporation, New York, N.Y.

[21] Appl. No.: 28,366

[22] Filed: Apr. 9, 1979

[51] Int. Cl.³ .............................................. H03G 3/30
[52] U.S. Cl. .................................... 330/278; 330/288
[58] Field of Search ............... 330/127, 129, 138, 278, 330/280, 288; 307/299 A

[56] References Cited

U.S. PATENT DOCUMENTS

| | | | |
|---|---|---|---|
| 3,344,355 | 9/1967 | Massman | 330/280 X |
| 3,391,311 | 7/1968 | Lin et al. | 357/40 |
| 3,835,410 | 9/1974 | Wittlinger | 330/288 |
| 3,855,540 | 12/1974 | Leidich | 330/273 |
| 3,979,606 | 9/1976 | Ahmed | 307/235 T |
| 4,019,071 | 4/1977 | Ahmed | 307/296 R |

OTHER PUBLICATIONS

Yang, "Small-Signal Characteristics of the Diode-Stabilized Linear Integrated Devices," *IEEE Journal of Solid State Circuits*, vol. SC-3, No. 2, Jun., 1968, pp. 190-193.

*Primary Examiner*—James B. Mullins
*Attorney, Agent, or Firm*—Paul J. Rasmussen; E. P. Herrmann; Allen LeRoy Limberg

[57] ABSTRACT

A current amplifier is disclosed, the current gain of which varies directly with changes in input current. A first transistor, arranged as a slave mirroring transistor provides output signal current responsive to a multimode transistor master mirroring circuit. The master mirroring circuit includes two master mirroring transistors connected in parallel for receiving input signal current and generating potential for controlling the slave transistor. The first master mirroring transistor includes a serially connected resistor in its principal conduction path, which transistor being arranged to have higher conductance than the second master mirroring transistor, conditions it to receive substantially all of the input signal current for low values of signal and thereby establishing the circuit gain in accordance with the ratio of conductances of the first master and slave mirroring transistors. For higher input signal levels the potential developed across the serially connected resistor causes the input current to be diverted to the second master mirroring transistor thereby establishing the circuit gain in accordance with the conductance ratio of the slave and second master mirroring transistors.

12 Claims, 7 Drawing Figures

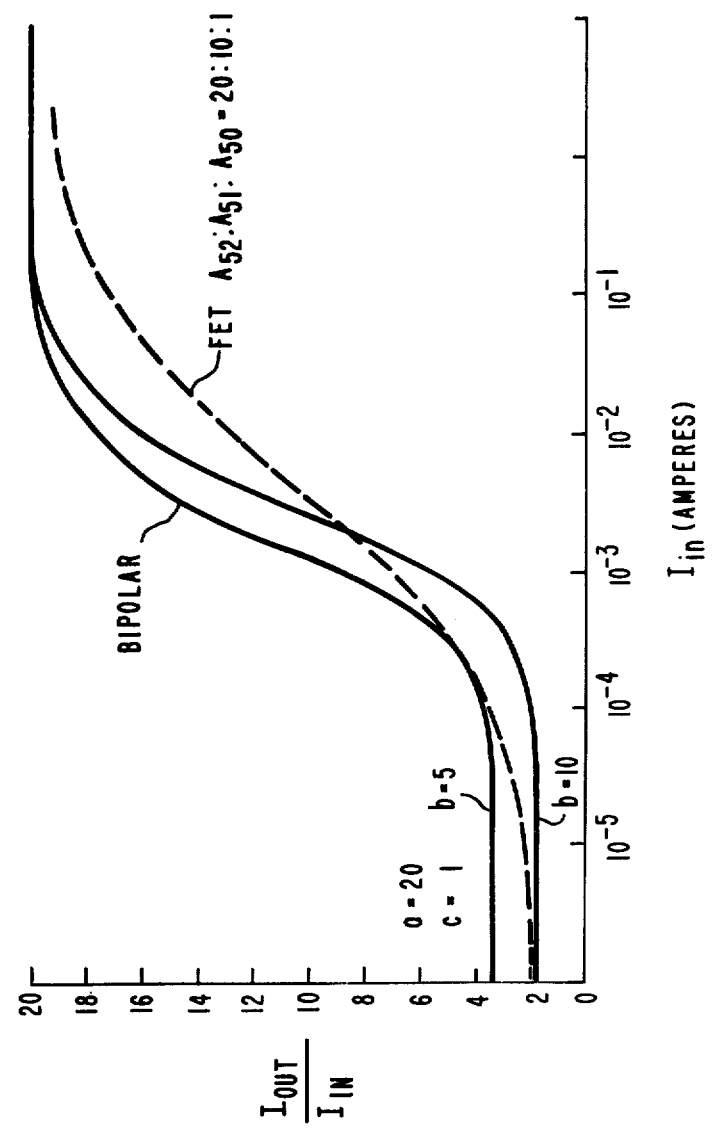

VARIABLE GAIN CURRENT AMPLIFIER

The Government has rights in this invention pursuant to Purchase Order No. 2GD-692020 under Contract No. DAAA09-76-C-2001 awarded by the Department of the Army.

This invention relates to current amplifiers, in particular a current amplifier having input-current-dependent gain characteristics.

Circuits involving rectification or charge integration, as for example some automatic gain control, AGC, circuits, frequently exhibit non-linear output signal characteristics. These characteristics are manifested by an undesirable reduction in circuit response for higher levels of input signal amplitudes. Where linear response is required independent of signal amplitude, the output signal from such a non-linear circuit, e.g., AGC, must be processed by a further non-linear circuit to compensate for the initial non-linearities. Typical processing circuits for this type of application are amplifiers which are arranged to exhibit increased or decreased gain as a function of signal amplitude, themselves controlled by an AGC circuit.

Current mirror amplifiers include a current-to-voltage converter for receiving input signal current to generate a control signal, which signal is applied to a voltage-to-current converter to produce an output signal current related to the input signal by a constant gain factor. The more basic integrated circuit current mirror amplifiers are generally an arrangement of transistors of similar conductivity type having similar junction diffusion profiles in such fashion that the circuit gain factor is ultimately determined by the ratio of area parameters of a master (input current-to-voltage converter) and a slave (output voltage-to-current converter) transistor.

E. S. Yang in his article, "Small-Signal Characteristics of the Diode-Stabilized Linear Integrated Devices," IEEE, JSSC, Vol. SC-3, No. 2, June 1968, demonstrated that the gain factor of typical current mirror amplifiers can be established by incorporating passive resistive elements serially connected in the amplifier input and output circuits. Yang noted that for non-equal resistive elements in the input and output circuits the amplifier gain would not remain constant for input current variations and indicated this to be a disadvantage. A. A. A. Ahmed took advantage of the gain variability resulting from the unequal resistive elements in his "Current Level Detector," U.S. Pat. No. 3,979,606 issued Sept. 7, 1976 to develop a current amplifier having substantially zero gain until a certain input current amplitude is attained, at which point the amplifier exhibits relatively high gain. This implementation is achieved by using a bipolar two-ratio current mirror realized with a master mirroring transistor having a resistor in its emitter circuit and a slave mirroring transistor having a further resistor in its emitter circuit. The gain for low levels of current is established by the ratio of emitter-base junction areas of the master and slave transistors while the gain for higher levels of input current is established by the ratio of the resistors.

The present invention departs from conventional current mirror amplifier construction to produce a current amplifier having three distinct gain regions to respond to relatively low, intermediate and relatively high input signal amplitudes.

The amplifier employs a typical current mirror amplifier output voltage-to-current converter section with an atypical multimode input current-to-voltage converter. The voltage-to-current converter comprises a first transistor having its emitter electrode connected to a common terminal, its collector electrode connected to an output terminal and its base electrode connected to receive control potential. The current-to-voltage converter comprises second and third transistors and a resistor. These devices are connected between the signal input terminal and the common terminal to generate a control potential related to the conductance parameters of the three devices and dependent upon the signal amplitude. The second transistor having its collector and base electrodes interconnected has its collector-emitter conduction path connected between signal input and common terminals. The third transistor having its collector and base electrodes interconnected has its collector-emitter conduction path serially connected with the resistor between the input and common terminals.

The circuit gain for increasing input current levels is initially established by the ratio of the emitter-base junction area of the first transistor to the combined junction areas of the second and third transistors. At intermediate input current levels potential drop across the resistor creates a current dependent increasing gain function. Finally at relatively higher current levels, circuit gain is substantially the ratio of the emitter-base junction area of the first transistor to the emitter base junction area of the second transistor.

In the drawings,

FIG. 7 is a graph of the general current gain characteristics of the FIG. 1 and FIG. 3 circuits.

Figure 1:
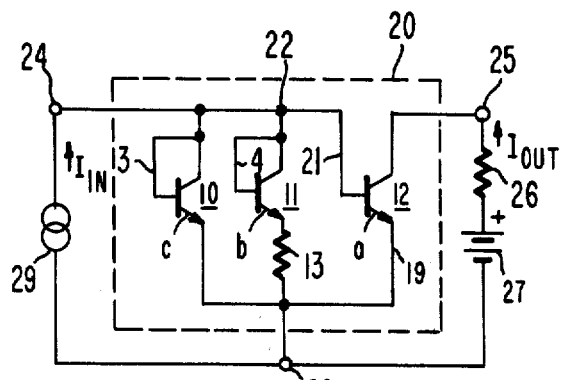
FIGS. 1, 3 and 4 are schematic diagrams of basic embodiments of the invention.

The basic variable gain current amplifier is shown in the FIG. 1 circuit circumscribed by the dashed box 20. Input signal current is applied to input terminal 24 by current signal source 29. Output signal current is supplied at terminal 25 and directed through load element 26 and d.c. potential supply 27.

The circuit 20 operates as a self-adjusting variable-gain current mirror amplifier. Output transistor 12 is arranged as a slave mirroring transistor while parallely connected transistors 10 and 11 operate as master mirroring transistors tending to operate separately for different levels of signal input current. Transistors 10 and 11 are assumed to be similar except for the area of their respective base-emitter junctions. Thus for similar bias parameters applied to transistors 10 and 11, transistor 11 will conduct a current related to the current conducted by transistor 10 as the ratio of the base-emitter junction area of transistor 11 to that of transistor 10.

Input current applied to terminal 24 splits between the collector circuits of transistors 10 and 11. The ratio of the current conducted by the respective transistors depends upon the ratio of their base-emitter junction areas and the potential generated across serially connected resistor 13 in the emitter circuit of transistor 11. A range of input current amplitude exists where the potential generated across resistor 13 is insignificant relative to the base-emitter potentials generated in transistors 10 and 11. Within this input current range and presuming transistors 10 and 11 to have similar diffusion profiles transistors 10 and 11 exhibit the characteristics of a single composite transistor having a base-emitter junction area substantially equal to the sum of their respective base-emitter junction areas. The base-emitter potential generated by the composite of transistors 10 and 11, commensurate with the current conducted in their collector circuits by virtue of the feedback connections 3 and 4, is applied to slave mirroring transistor 12 via connection 21. Under these conditions the circuit current gain is constant and approximately equal to $a/(b+c)$ where a, b and c are respectively the areas of the base-emitter junctions of transistors 12, 11 and 10. See U.S. Pat. No. 3,391,311, "Constant Current Gain Composite Transistor," issued to Lin et al. on Feb. 2, 1966 for a detailed description of the current mirror operating characteristics.

Increasing the input current beyond this first or low range to an intermediate range, the voltage developed across resistor 13 becomes significant relative to the base-emitter potential of transistor 11. The potential applied to the base electrode of transistor 12 is the sum of the base-emitter potential $V_{bell}$ of transistor 11 and the potential $V_R$ developed across resistor 13. The circuit gain in this region is the composite of the constant gain factor due to the ratio of base-emitter junction areas of transistors 10 and 11 to that of transistor 12 and an increasing component due to the increasing potential across resistor 13 reducing the proportion between the conduction of transistor 11 and that of transistor 10.

In the third or high range of input currents the potential developed across resistor 13 in conjunction with the clamping action of the base-emitter junctions of transistors 10 and 12 tends to limit the portion of the input current conducted by transistor 11 to be small compared to that conducted by transistor 10. Further increases in input current are conducted by transistor 10 and the circuit gain, a/c, is determined by the ratio of the relative emitter-base junction areas a and c of transistors 12 and 10 respectively.

Figure 2:
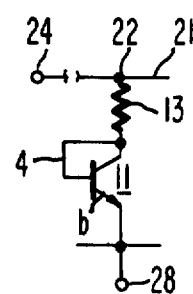
FIG. 2 is an alternative arrangement for two of the devices of the FIG. 1 circuits.

The series connection of transistor 11 and resistor 13 as shown in FIG. 1 is not unique. The arrangement of FIG. 2 wherein resistor 13 is connected in the collector circuit of transistor 11, between input terminal 24 and common terminal 28 will exhibit an identical response when substituted for the FIG. 1 arrangement. This may be clearly appreciated by considering 11 and 13 as a diode and resistor in series. The order of connection of independent serially connected devices has no influence on their separate operational parameters.

Analyzing the circuit more specifically confirms the foregoing description. The application of collector-to-base feedback to the transistors 10 and 11 condition them to conduct collector current. A voltage is generated across their base-emitter junctions commensurate with the emitter current conducted in the particular transistor. The relationship of collector current to base-emitter voltage for a bipolar transistor is given by the following expression:

$$I_C = I_S \exp(qV_{be}/kT) \quad (1)$$

where:
  k is Boltzmann's constant;
  T is temperature in degrees Kelvin;
  q is the charge of an electron;
  $I_S$ is the saturation current of the junction transistor; and
  $I_C$ is the collector current.

Ignoring the base currents of the transistors 10, 11 and 12 in FIG. 1 the input current $I_{in}$ is equal to the sum of the collector currents $I_{C10}$ and $I_{C11}$ of transistors 10 and 11 respectively. The output current $I_{out}$ is equal to the collector current $I_{C12}$ of transistor 12. Expressing these currents in the terms of equation 1 the following relationships result.

$$\begin{aligned}I_{in} &= I_{C10} + I_{C11} \\ &= cI_S \exp(qV_{be10}/kT) + bI_S \exp(qV_{be11}/kT) \quad (2)\\ I_{out} &= I_{C12} = aI_S \exp(qV_{be12}/kT) \quad (3)\end{aligned}$$

The saturation current $I_S$ in equations 2 and 3 is assumed to be the saturation current for a unit area device and the factors a, b and c denote the relative areas of the transistors 12, 11 and 10.

The base-emitter potential $V_{be10}$ of transistor 10 equals the base emitter potential $V_{be12}$ of transistor 12 by virtue of the common base connection 21 and common emitter connection 28. $V_{be10}$ and $V_{be12}$ also equal the sum of the potential drop $V_R = I_{C11}R_{13}$ across resistor 13 and the base-emitter potential $V_{bell}$ of transistor 11. Taking account of these equalities in equations (2) and (3), dividing equation (3) by (2) and simplifying the following relationship results:

$$I_{out}/I_{in} = \frac{a}{c + b \exp(-qI_{C11}R_{13}/kT)} \quad (4)$$

This equation represents the circuit current gain. Collector current $I_{C11}$ conducted by transistor 11 is the controlling factor and is the only variable on the right hand side of equation (4). For $I_{C11}$ greater than a certain value established by resistor value $R_{13}$ the term "b exp $(-qI_{C11}R_{13}/kT)$" is insignificant relative to "c" and equation (4) reduces to a circuit gain of a/c. On the other hand for low values of $I_{C11}$ the factor "exp $(-qI_{C11}R_{13}/kT)$" approaches 1 and the circuit gain of (4) approaches $a/(c+b)$. Between these two current ranges the gain is expressed by equation 4 which function is plotted in FIG. 7.

Figure 3:
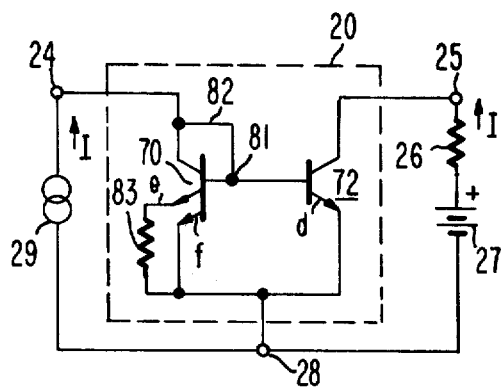

The FIG. 3 circuit shows a similar current amplifier with the two master mirroring transistors 10 and 11 of FIG. 1 subsumed in the single transistor 70 having two emitter electordes e and f with relative emitter-base junction areas e:f. The FIG. 3 circuit gain function is similar to equation (4) with the appropriate substitution of relative parameters.

Figure 5:
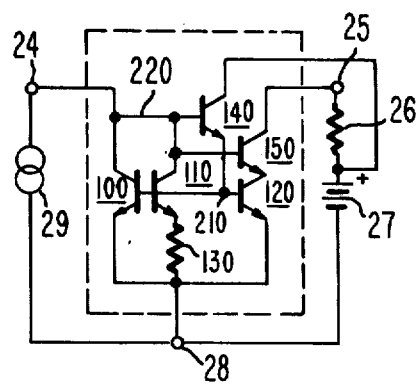
FIGS. 5 and 6 are schematic diagrams of more specialized embodiments of the invention.
Figure 6:
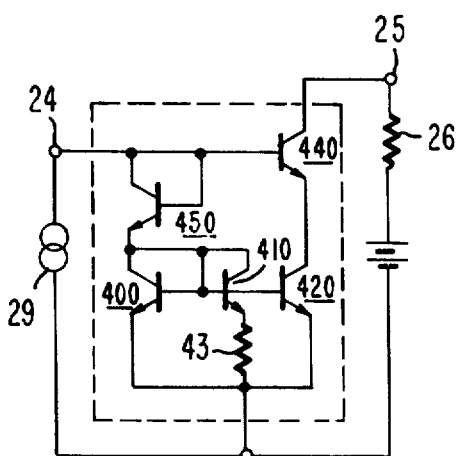

FIGS. 5 and 6 incorporate known current mirror amplifier refinements to the FIG. 1 circuit which tend to promote enhanced performance. The FIG. 5 circuit includes emitter-follower transistor 140 to provide the base-collector feedback for transistors 100 and 110 for conditioning them to conduct the input current. More significantly transistor 140 reduces the current diverted from the input signal to the base electrodes of transistors 100, 110 and 120 by the factor $\beta$, the forward current gain of transistor 140. Transistor 150 included in the collector circuit of transistor 120 by virtue of emitter-follower action maintains the collector of 120 at a potential similar to that at the collectors of transistors 100 and 110 tending to reduce nonlinearities contributed by varying collector-emitter potentials.

The FIG. 6 circuit, on the other hand, includes diode connected transistor 450 and transistor 440 for the purpose of maintaining the collector-emitter potentials of the input and output transistors substantially the same. Conditioning the input, 400, and output, 240 transistor to operate under like dynamic conditions tends to reduce undesired circuit nonlinearities for large input and output currents, see U.S. Pat. No. 3,835,410 entitled "Current Amplifier" issued to H. A. Wittlinger, Sept. 10, 1974.

Figure 4:
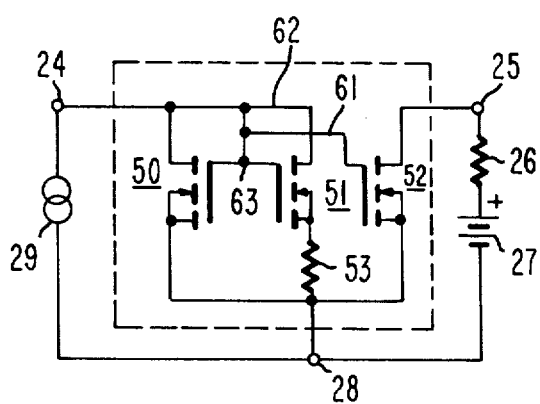

The FIG. 4 current amplifier is a field effect transistor counterpart of the FIG. 1 circuit. The general operation of the circuit is similar to that of the FIG. 1 circuit but the gain in the intermediate input current range takes a different form due to the square-law current-voltage operating characteristics of the field effect transistors. The drain current of a field effect transistor is expressed by the relationship:

$$I_D = (w/l)K(V_{gs} - V_T)^2 \tag{5}$$

where:

K is a conductance factor common to similar devices;
w/l is the channel width to length ratio;
$V_{gs}$ is gate to source voltage, and
$V_T$ is the threshold or turn-on voltage.

Expressing the drain currents of the FIG. 4 transistors in the terms of equation (5) and performing a similar analysis as in deriving equations (2), (3) and (4) and equation for the current gain of the FIG. 4 circuit can be shown to be:

$$I_{out}/I_{in} = \frac{A_{52}}{A_{50} + A_{51}/(1 + R_{53}\sqrt{A_{51}I_{D51}})^2}$$

where $A_{ii}$ is the product K w/l for the transistor designated by the subscript. Equation 6 is plotted in FIG. 7.

The circuits presented in the included drawings are representative embodiments of the invention. One skilled in the art of current amplifiers, armed with the foregoing description, will be able to generate other embodiments within the spirit of the invention and the claims should be construed accordingly.

What I claim is:

1. A current amplifier having input-current-dependent gain and comprising:
   a current-to-voltage converter responsive to applied signal current for generating a control potential, the converter manifesting first, second and third signal current-to-voltage transfer functions for relatively low, intermediate and relatively high input signal current amplitude ranges respectively; and
   a voltage-to-current converter responsive to the control potential for providing an output current, which voltage-to-current converter exhibits output current related to signal current by first and second substantially constant factors respectively for the relatively low and relatively high amplitude ranges, and is variably related to signal current in the intermediate amplitude range.

2. A current amplifier as set forth in claim 1 wherein the voltage-to-current converter comprises a first transistor having first and second electrodes and a principal conduction path therebetween, and a control electrode, potential between the control and first electrodes controlling the principal conduction path;
   means for applying the control potential from the current-to-voltage converter between the first and control electrodes of the first transistor, poled to induce conduction in the first transistor principal conduction path; and
   means for receiving output current from the second electrode of the first transistor.

3. A current amplifier as set forth in claim 2 wherein the current-to-voltage converter comprises:
   current input, voltage output and common terminals,
   second and third transistors of the same conductivity type as the first transistor and having similar diffusion profiles as the first transistor, and having respective area-dependent conductance parameters, each transistor having respective first and second electrodes and a principal conduction path therebetween, a control electrode; potential between the control and first electrode controlling the respective conduction of the principal conduction paths;
   first feedback means connecting the control and second electrodes of the second transistor for conditioning it to conduct;
   second feedback means connecting the control and second electrodes of the third transistor for conditioning it to conduct;
   means connecting the principal conduction path of the second transistor between the current input and common terminals; resistive means;
   means connecting the resistive means and the principal conduction path of the third transistor in series between the first and second electrodes of the second transistor; and
   means connecting the control electrode of the second transistor to the voltage output terminal, the potential between the voltage output and common terminals being available as control potential for the voltage-to-current converter.

4. A current amplifier as set forth in claim 3 wherein each of the transistors is a bipolar transistor.

5. A current amplifier as set forth in claim 3 wherein each of the transistors is a field effect transistor.

6. A current amplifier as set forth in claim 3 wherein said first feedback means essentially consists of a direct connection between the control and second electrodes of said second transistor; and wherein said second feedback means essentially consists of a direct connection between the control and second electrodes of said third transistor.

7. A current amplifier as set forth in claim 3 wherein the first feedback means comprises:
   a fourth transistor having first and second electrodes and a principal conduction path therebetween, and a control electrode; potential between the first and control electrode controlling the principal conduction path;
   respective means connecting the first and control electrodes of said fourth transistor to the control and second electrodes respectively of the second transistor; and
   means connecting the second electrode of said fourth transistor for receiving supply current.

8. A current amplifier as set forth in claim 2 wherein the first transistor is a bipolar device and the current-to-voltage converter comprises:
   a further bipolar transistor of the same conductivity type as the first transistor, having similar diffusion profiles, and having collector and base and first and second emitter electrodes, having first and second emitter-base junctions, the areas of the first and second emitter-base junctions being in a prescribed ratio;
   resistive means connected between the first and second emitter electrodes;

means for supplying signal current between the collector electrode and the first emitter electrode of the further transistor;

means connecting the collector electrode of the further transistor to its base electrode, for providing feedback to condition the further transistor to generate a control potential commensurate with current conducted in its collector electrode, the control potential being available between the base electrode and first emitter electrode.

9. A current amplifier having input-current-dependent gain and comprising:

first and second terminals for applying input current and output current respectively;

a third terminal for applying reference potential;

first, second and third transistors each having respective first and second electrodes and a principal conduction path therebetween, and having respective control electrodes; potential between the respective control and first electrodes controlling the respective conduction paths;

resistive means connected between the first electrode of the second transistor and the third terminal;

respective means connecting the first electrodes of the first and third transistors at the third terminal;

means connecting an interconnection of the second electrodes of the first and second transistors to the first terminal for receiving input signal current;

respective means connecting the control electrodes of the first, second and third transistors to a first circuit node;

feedback means connecting the interconnection of the second electrodes of the first and second transistors to the first circuit node for conditioning the first and second transistors to conduct input current; and means connecting the second electrode of the third transistor to the second terminal for providing output current.

10. A current amplifier as set forth in claim 9 wherein the feedback means comprises a direct connection without substantial impedance.

11. A current amplifier as set forth in claim 9 wherein the feedback means comprises:

a fourth transistor of the same conductivity type as the first transistor and having first and second electrodes, and a principal conduction path therebetween, and having a control electrode, the conduction path being controlled by potential between the control and first electrodes;

respective means connecting the first and control electrodes of said fourth transistor respectively to said interconnection and the first circuit node; and means connecting the second electrode of said fourth transistor for receiving supply current.

12. A current amplifier as set forth in claim 9 wherein the means connecting the second electrode of the third transistor to the second terminal comprises the principal conduction path of a further transistor and the means connecting the interconnection of the second electrodes of the first and second transistors to the first terminal comprises the principal conduction path of a still further transistor, said further and still further transistors being of the same conductivity type as the first, second and third transistors and having first, second and control electrodes, the control electrodes of said further and still further transistors connected for receiving a portion of the input signal current to condition them for conduction.

* * * * *